United States Patent [19]
Wang

[11] Patent Number: 4,887,140
[45] Date of Patent: Dec. 12, 1989

[54] CLOVER DESIGN LATERAL EFFECT POSITION-SENSITIVE DEVICE

[75] Inventor: Wanjun Wang, Austin, Tex.

[73] Assignee: Board of Regents, The Univ. of Texas System, Austin, Tex.

[21] Appl. No.: 344,105

[22] Filed: Apr. 27, 1989

[51] Int. Cl.$^4$ .................... H01L 27/14; H01L 29/06; H01L 23/48; H01J 40/14

[52] U.S. Cl. .................................... 357/30; 357/20; 357/58; 357/68; 250/211 J

[58] Field of Search .................... 357/30 D, 30 F, 68, 357/58, 20, 30 R; 250/211 J

[56] References Cited

U.S. PATENT DOCUMENTS

| | | | |
|---|---|---|---|
| 3,028,500 | 4/1962 | Wallmark | 250/211 |
| 3,207,902 | 9/1965 | Sandborg | 250/83.3 |
| 3,214,652 | 10/1965 | Knowles | 317/235 |
| 3,368,123 | 2/1968 | Rittmann | 317/235 |
| 3,742,223 | 6/1973 | Carr et al. | 250/211 J |
| 3,792,257 | 2/1974 | Gardner | 250/211 J |
| 3,925,658 | 12/1975 | Connors | 250/211 J |
| 3,971,057 | 7/1976 | Connors et al. | 357/30 |
| 4,131,793 | 12/1978 | Stoutmeyer et al. | 250/211 J |
| 4,602,282 | 7/1986 | Kurono et al. | 358/110 |
| 4,629,882 | 12/1986 | Matsuda et al. | 250/211 J |

OTHER PUBLICATIONS

United Detector Technology brochure for Position Sensing Photodetectors (date unknown).
Silicon Detector Corp. brochure for Position Sensors (date unknown).
Hamamatsu Corp. brochure for Position-Sensitive Detectors (1985).

*Primary Examiner*—Martin H. Edlow
*Assistant Examiner*—Stephen D. Meier
*Attorney, Agent, or Firm*—Flehr, Hohbach, Test, Albritton & Herbert

[57] ABSTRACT

Disclosed is an improved lateral effect position-sensitive device having a clover design and including a semiconductor body including a first doped surface-oriented region of one conductivity type, a second doped surface-oriented region of opposite conductivity type, and a layer of intrinsic semiconductor material separating the first region and the second region. The first region has concave boundaries and at least four vertices. A first plurality of electrical contacts electrically contacts the vertices, and a second plurality of contacts electrically contacts intermediate portions of the concave boundaries. Conductors electrically interconnect each of the second plurality of contacts with one of the first plurality of contacts.

13 Claims, 3 Drawing Sheets

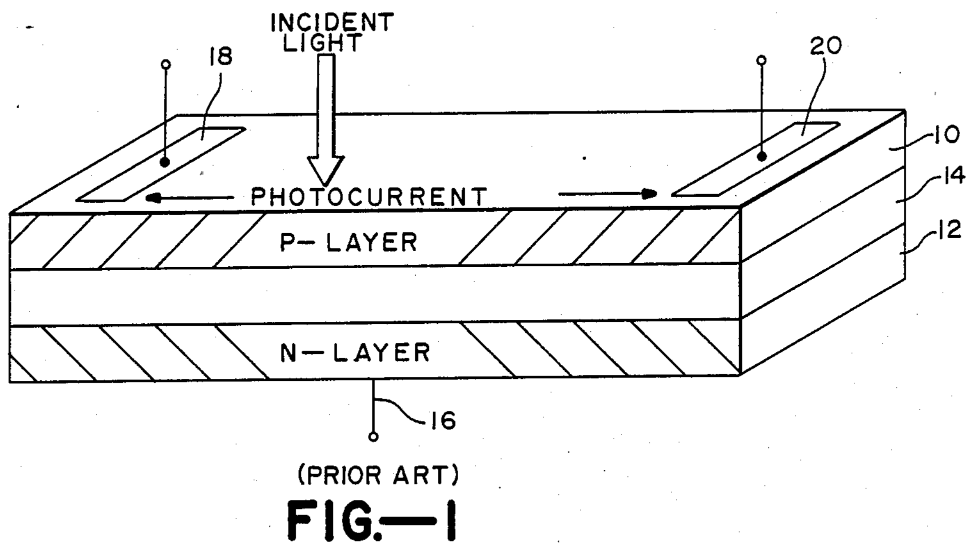
(PRIOR ART)
FIG.—1
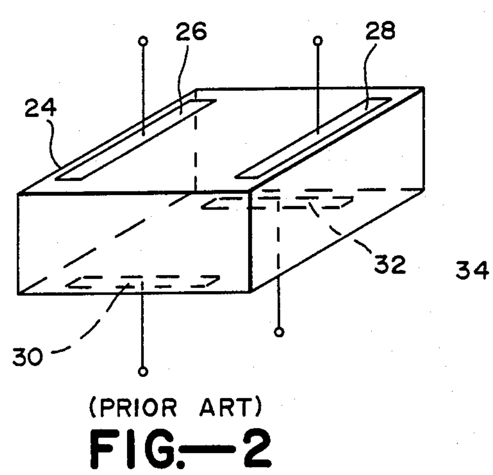
(PRIOR ART)
FIG.—2
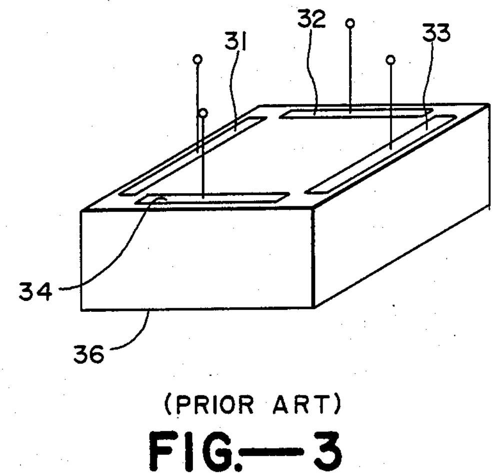
(PRIOR ART)
FIG.—3
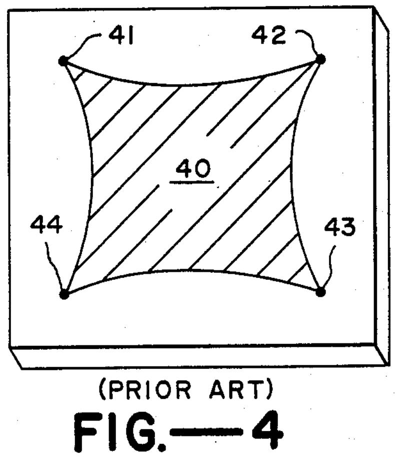
(PRIOR ART)
FIG.—4
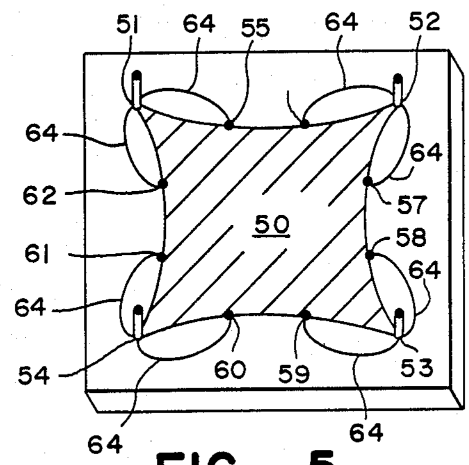
FIG.—5

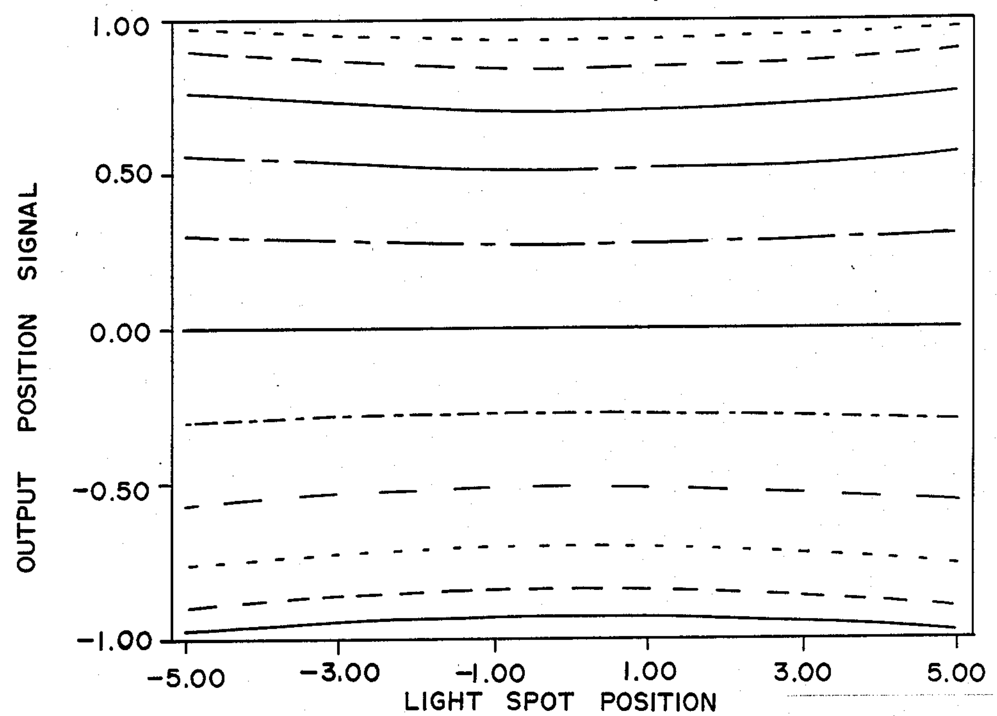
FIG.—6
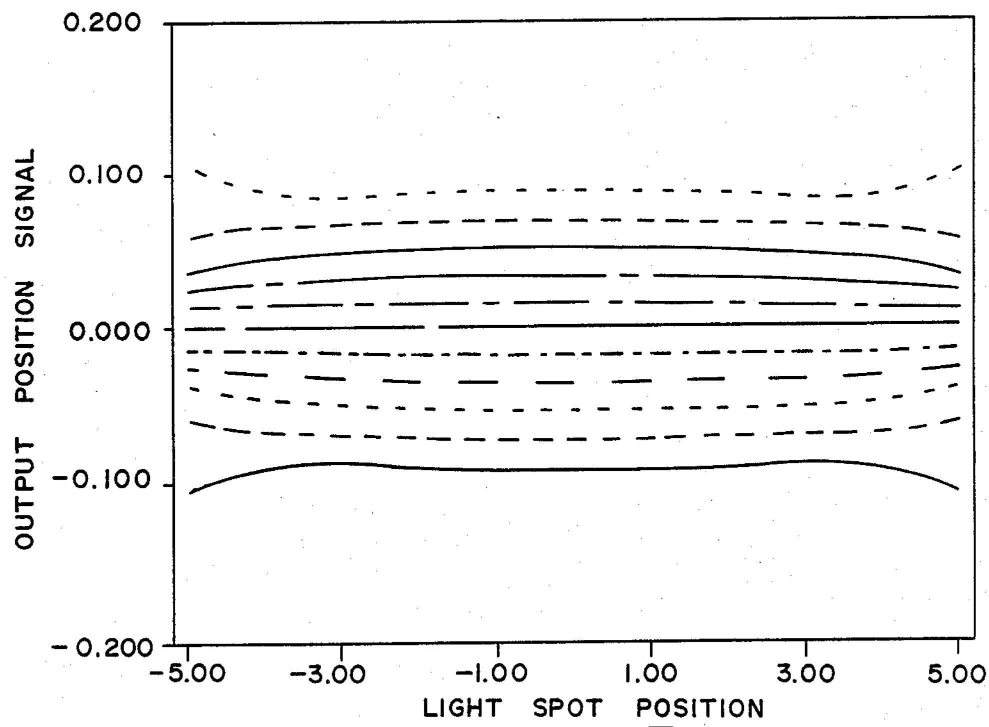
FIG.—7

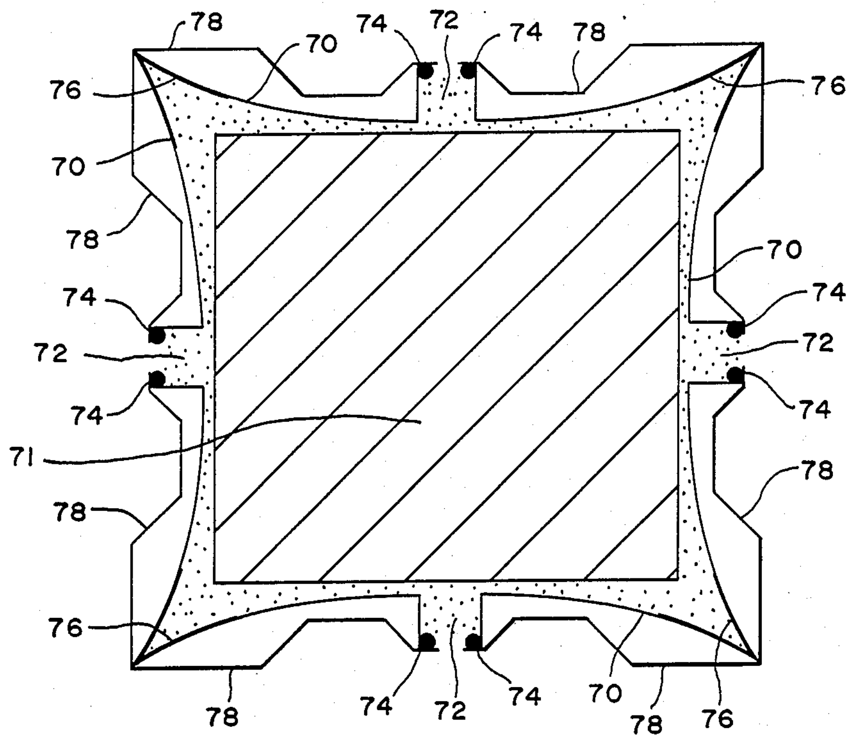
FIG.—8
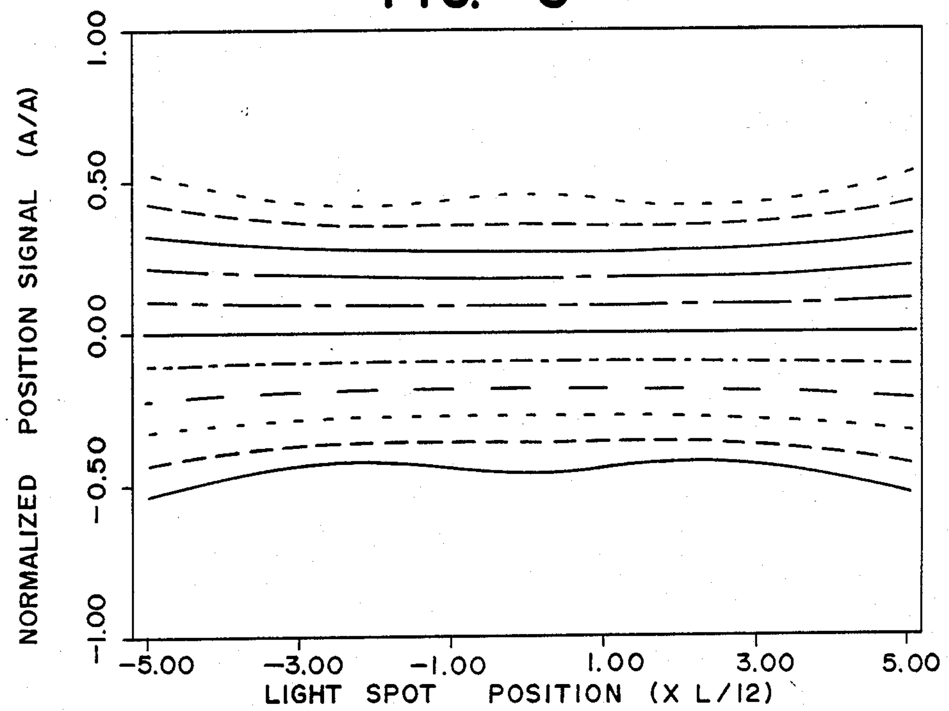
FIG.—9

CLOVER DESIGN LATERAL EFFECT POSITION-SENSITIVE DEVICE

BACKGROUND OF THE INVENTION

This invention relates generally to lateral position-sensitive devices (PSDs), and more particularly the invention relates to an improved PSD of tetralateral configuration.

Lateral effect position-sensitive devices (PSDs) are semiconductor structures including a p-doped layer and an n-doped layer separated by an intrinsic (i.e. undoped or lightly doped) semiconductor layer. Typically, the semiconductor material is silicon, but other semiconductor materials such as gallium arsenide have been used. Gold/beta-silicon carbide Schottky barriers have been examined, also.

The PSD relies on the lateral photoeffect first discovered by Schottky in 1930 and later exploited by Wallmark. See J. T. Wallmark, "A New Semiconductor Photo Cell Using Lateral Photo Effect," Proceedinqs IRE, Vol. 45 pp. 474–483, 1957; U.S. Pat. No. 3,028,500 for "Photoelectric Apparatus."

Several device geometries are known including the one-dimensional PSD in which two electrodes are positioned in spaced alignment on one doped surface, the duolateral structure in which a pair of electrodes are positioned in spaced alignment on each doped surface in 90° orientation to give x and y outputs, and the tetralateral structure in which two pairs of electrodes are positioned in spaced alignment with 90° orientation between pairs on only one doped layer to get x and y position outputs. An improved tetralateral structure, called a pin-cushion type, has curved outer boundaries of the p and n doped regions with point contacts at the four corners of one doped region. The pin-cushion PSD combines the best aspects of the duolateral PSD with those of the tetralateral PSD by putting all of the contacts on one side of the p-n junction and minimizing the interference between x and y outputs through boundary definition and electrode shape. Such a device is commercially available from Hamamatsu Corporation of Japan.

In operation, the p-n junction of the device is fully reverse-biased. A light spot incident on a doped surface generates an electric charge proportional to the light intensity at the incident position. This electric charge creates photo-currents which are detected by the electrodes. Movement of the light spot in the sensitive area of the doped layer between the electrodes changes the current on each of the electrodes whereby continuous position data can provide measurements of very small (submicron) spot movement.

The tetralateral PSD has several disadvantages relative to the duolateral PSD due to the placement of all electrodes on one surface. These include signal interference between the electrodes resulting in inherent nonlinearity and the division of the generated photocurrent into four parts so that resolution is roughly half that of the duolateral PSD. However, the tetralateral PSD has advantages when compared to the duolateral PSD including a faster response due to having both the x and y contacts on one surface, a much lower "dark current" or current inherent in a reverse-biased p-n junction even in a dark environment. Further, the tetralateral PSD has an easier bias application and a lower fabrication cost since only one side of the p-n junction requires close tolerance fabrication.

As noted above, the pin-cushion type of tetralateral PSD combines the best aspects of the duolateral PSD with those of the tetralateral PSD but still has limits in signal resolution, dark current, and output sensitivity.

SUMMARY OF THE INVENTION

An object of the present invention is an improved lateral effect position-sensitive device.

Another object of the invention is improved linearity and position resolution using a tetralateral PSD.

A feature of the invention is a doped region having curved boundaries with electrodes at corners of the boundaries selectively interconnected with electrodes intermediate to the corner of the boundaries.

Briefly, a lateral effect position-sensitive device in accordance with the invention includes a semiconductor body having a first doped surface-oriented region of a first conductivity type, a second doped surface-oriented region of opposite conductivity type, and a layer of intrinsic semiconductor material separating the first region and the second region. The first region has curved, concave boundaries and at least four vertices. A first plurality of electrical contacts is provided with each contact electrically contacting a vertex. A second plurality of contacts is provided with each of the second plurality of contacts contacting an intermediate portion of one of the concave boundaries. Means is provided for electrically interconnecting each of the second plurality of contacts with one of the first plurality of contacts.

In a preferred embodiment, both the first region and the second region have identical curved boundaries with the boundaries of the two regions being aligned. Further, each of the concave boundaries has the same curvature. Each of the first plurality of contact means comprises a protruding point contact and an elongated contact at each vertex. Further, in accordance with a preferred embodiment, each of the second plurality of contacts comprises a point contact half-way along each concave boundary. The means electrically interconnecting the first and second contacts preferably comprises a metal layer laid on a surface of the semiconductor body along at least part of the boundary of the first region to pick up leakage current.

The invention and objects and features thereof will be more readily apparent from the following detailed description and appended claims when taken with the drawing.

BRIEF DESCRIPTION OF THE DRAWINGS

FIG. 1 is an isometric view of a one-dimensional PSD in accordance with the prior art.

FIG. 2 is an isometric view of a duolateral PSD in accordance with the prior art.

FIG. 3 is an isometric view of a tetralateral PSD in accordance with the prior art.

FIG. 4 is a plan view of a pin-cushion PSD in accordance with the prior art.

FIG. 5 is a plan view of a clover design PSD in accordance with one embodiment of the present invention.

FIG. 6 and FIG. 7 are graphs illustrating the normalized x signal output as a function of the normalized actual light spot for a plurality of equidistant x direction lines for the tetralateral PSD and the pincushion PSD, respectively.

FIG. 8 is a plan view of a clover PSD in accordance with another embodiment of the invention.

FIG. 9 is a graph illustrating normalized x signal output as a function of the normalized actual light spot for a plurality of equidistant x direction lines using the geometry of the clover PSD illustrated in FIG. 8.

DETAILED DESCRIPTION OF ILLUSTRATIVE EMBODIMENTS

Referring now to the drawing, FIG. 1 is an isometric view of a one-dimensional PSD in accordance with the prior art and which illustrates the operating principle of the PSD. The device includes a semiconductor structure, silicon for example, including a p-doped layer 10, an n-doped layer 12, and an intrinsic layer 14 separating layers 10, 12. A contact 16 is connected to the n layer for receiving a positive voltage potential for reverse-biasing the p-n junction. The top surface of the p-layer 10 has two spaced elongated electrodes 18 and 20 which receive a varying photo-current upon the application of a light spot incident between the electrodes as illustrated. An electric charge proportional to the light energy is generated at the incident position of the light spot, and this electric charge is driven through the p-layer and is collected by the electrodes 18, 20 The photo-current collected by each electrode is inversely proportional to the distance between the incident position and the electrode. Accordingly, it is possible to ascertain the distance of an incident light from the two electrodes.

FIG. 2 is an isometric view of a duolateral PSD in accordance with the prior art. A semiconductor body 24 is provided having a p layer, an n layer, and an intrinsic layer as shown in FIG. 1. A first pair of electrodes 26 and 28 are provided on the surface of the p layer to determine the position of an incident light spot as described above with reference to FIG. 1. Additionally, a second pair of elongated electrodes 30 and 32 are provided on the surface of the n layer and oriented 90° with respect to the electrodes 26, 28 for determining the distance of an incident spot from the two electrodes 30, 32. Accordingly, the x and y coordinates of an incident light spot can be determined.

FIG. 3 is an isometric view of a tetralateral PSD in accordance with the prior art which is similar to the duolateral PSD of FIG. 2 but in which all electrodes 31–34 are formed on one surface of the semiconductor body 36. The duolateral PSD illustrated in FIG. 2 is inherently linear because it has a pair of parallel contacts on each resistive surface layer, corresponding to the x and y outputs respectively. No interference can occur because the two electrode pairs on the two resistive layers are separated by the fully reverse-biased p-n junction. The tetralateral PSD illustrated in FIG. 3 can use only one sensitive surface of the p-n junction with the four extended ohmic contacts put on one side and one cathode on the other side of the p-n junction for the reverse-biased connection. Having the four electrodes on the same surface pair makes interference inevitable, resulting in inherent non-linearity, and the generated photo-current is divided into four parts instead of two parts whereby the resolution is roughly half that of the duolateral PSD. However, the tetralateral PSD has advantages when compared to the duolateral PSD in providing a faster response due to having both the x and y contacts on one surface, a much lower dark current, easier bias application, and a lower fabrication cost since only one side of the p-n junction requires close tolerance fabrication.

FIG. 4 is a plan view of a pin-cushion lateral effect PSD in which an attempt is made to combine the best aspects of the duolateral PSD with those of the tetralateral PSD. Such a device is commercially available from Hamamatsu Corporation of Japan. In the pin-cushion geometry, the boundaries of the doped region in at least one of the outer layers have concave boundaries which define the doped region 40. The concave curves of the boundaries are identical and can vary from a circular curve to a more complex curve. Electrical contacts are made at the four vertices of the curved boundaries as illustrated at 41–44. The effective transducer area of the pin-cushion geometry is formed by a rectangle whose sides are tangent to the innermost points on the boundary edges. The pin-cushion PSD is linear over a much broader range of its active surface than the tetralateral PSD. However, the pin-cushion PSD has several major disadvantages. First, the point electrodes make it impossible to operate in a fully reverse-bias condition because the current densities are sufficiently high to cause significant photopotential differences; these potential differences offset the reverse bias at the corners and make surface recombination inevitable by causing a decrease in resolution due to signal loss. Further, in the absence of a fully reverse-biased condition, the lateral fall-off parameter will not be equal to zero. Since the fall-off parameter depends strongly on temperature, this would make the pin-cushion PSD more sensitive to temperature variations than the tetralateral and duolateral PSD. Additionally, the pin-cushion structure causes a severe reduction in the inherent sensitivity.

FIG. 5 is a plan view of a clover-leaf lateral PSD geometry in accordance with the present invention which improves on the performance of the pin-cushion PSD while retaining the advantageous features of the pin-cushion PSD. The doped region 50 of the clover PSD is similar in configuration to the pin-cushion PSD in having a plurality of concave boundaries and contacts 51–54 at the vertices of the boundaries. In addition, a second plurality of contacts 55–62 are provided at the intermediate portions of the boundaries, and each contact of the second plurality is interconnected with a contact at a vertex by the interconnections 64. The clover PSD is nearly as linear as the duolateral PSD while having similar position resolution, but since all the contacts are on a single side of the p-n junction, the dark current is lower, response time is faster, and the reverse-bias can be applied more easily. The clover design provides optimum characteristics in that it combines the best aspects of the prior-art tetra and duolateral PSDs without their disadvantages.

Consider now the graphs of FIGS. 6 and 7 which are the normalized x signal output as a function of the normalized actual light spot x location for equidistant x direction lines in a tetralateral PSD and in a pin-cushion PSD, respectively. From FIG. 6 it is seen that the tetralateral PSD is only linear over a very small region of the active area, and the distortion becomes very serious toward the boundary of the sensitive surface. The calculated response of a pin-cushion PSD illustrated in FIG. 7 shows that the pin-cushion PSD is linear over a much broader range of its active surface than the tetralateral PSD. However, the linearity dramatically decreases at the PSD corners.

FIG. 9 is a plot illustrating the normalized x signal output as a function of the normalized actual light spot x location for a plurality of equidistant direction lines for the clover PSD embodiment illustrated in FIG. 8.

Referring first to the plan view of the clover PSD shown in FIG. 8, the concave outer boundaries 70 of the doped region 71 no longer have a strictly pin-cushion shape since the extensions 72 at intermediate portions of the boundaries permit point contacts 74 to be slightly offset. Four short metal contacts 76 are provided at the corners or vertices of the concave outer boundaries, and the contacts 76 are interconnected with adjacent point contacts 74 (i.e. very short length contacts) by connecting wires or metal layers 78 laid near the concave boundaries 70 in order to pick up leakage current from the finite resistance isolation boundary. This helps improve the linearity of the device.

For the x output signal in the clover PSD, the contributions from the two neighboring point contacts of each contact pair along the primarily y-oriented boundaries will cancel. This results since, over most of the sensitive area, the resistances from the incident position of the light beam to each of the two neighboring point contacts are of almost the same value. If the point contact pairs are slightly offset from the boundaries, as shown in FIG. 8, the assumption of cancellation is valid for a device with an effective size of L by L as long as the light source is at least L/12 away from the boundary.

Referring now to the response of the clover design as shown in FIG. 9, the inherent sensitivity of the clover PSD is about five times that of the pin-cushion PSD, and the maximum distortion is slightly lower than that for the central region of the pin-cushion PSD. Both the conventional pin-cushion PSD and clover designs are nearly as linear as the duolateral PSD, but compared to the duolateral design the clover PSD has a faster response time, lower dark current, ease of fabrication, and a bias that can be more easily applied. For a given noise level, the resolution of the clover PSD is roughly twice that of a tetralateral PSD. The only disadvantage when compared to the duolateral geometry is the reduced inherent sensitivity; the range of signal amplitudes of the duolateral PSD with unity gain is twice that of a clover PSD.

There has been described a PSD having a clover tetralateral configuration which offers improved operating characteristics and easier fabrication. The clover design can be a very rough approximation of the duolateral PSD but with all of the contacts on a single side of the p-n junction. The protruding electrodes at corners help to reduce the crosstalk between the x and y signals, and the total length of the contacts on the resistive surface for the clover PSD is nearly that of a duolateral PSD. Unlike the pin-cushion PSD, the clover PSD may be fully reverse-biased, making the signal loss due to surface recombination unlikely and yielding a resolution close to that of the duolateral PSD. .

While the invention has been described with reference to specific embodiments, the description is illustrative of the invention and is not to be construed as limiting the invention. For example, the contacts can be to either the n-doped region or the p-doped region. While the doped region of the preferred embodiment has four concave boundaries and eight contacts to intermediate portions of the boundaries, the number of contacts and sides can vary. Thus, various modifications and applications may occur to those skilled in the art without departing from the true spirit and scope of the invention as defined by the appended claims.

I claim:

1. A lateral effect position-sensitive device comprising a semiconductor body including a first doped surface-oriented region of one conductivity type, a second doped surface-oriented region of opposite conductivity type, a layer of intrinsic semiconductor material separating said first region and said second region, said first doped region having concave boundaries and at least four vertices, a first plurality of electrical contacts each electrically contacting a vertex, a second plurality of contacts each electrically contacting an intermediate portion of one of said concave boundaries, and means electrically interconnecting each of said second plurality of contacts with one of said first plurality of contacts.

2. The lateral effect position-sensitive device as defined by claim 1 wherein both of said first and second doped regions have concave boundaries, said concave boundaries of said first doped region being aligned with the concave boundaries of said second doped region.

3. The lateral effect position-sensitive device as defined by claim 2 wherein all of said concave boundaries have the same curvature.

4. The lateral effect position-sensitive device as defined by claim wherein said first plurality of contacts includes lengths of electrically conductive material at each vertex, and said second plurality of contacts includes protruding point contacts.

5. The lateral effect position-sensitive device as defined by claim 4 wherein said second plurality of contacts is positioned substantially halfway along each boundary.

6. The lateral effect position-sensitive device as defined by claim 5 wherein said means electrically interconnecting each of said second plurality of contact with one of said first plurality of contacts comprises a metal layer laid on said surface of said semiconductor body near at least a portion of said boundary to thereby pick up leakage current.

7. The lateral effect position-sensitive device as defined in claim 1 wherein said semiconductor body is silicon.

8. The lateral effect position-sensitive device as defined by claim 1 wherein said semiconductor body is gallium arsenide.

9. The lateral effect position-sensitive device as defined by 1 wherein said second doped region is larger than said first doped region.

10. The lateral effect position-sensitive device as defined by claim 1 wherein said one conductivity type is p-type.

11. The lateral effect position-sensitive device as defined by claim 1 wherein said one conductivity type is n-type.

12. The lateral effect position-sensitive device as defined by claim 1 wherein each of said concave boundaries has an extension in an intermediate portion to accommodate said second plurality of contacts.

13. The lateral effect position-sensitive device as defined by claim 1 wherein said means electrically interconnecting each of said second plurality of contacts said second plurality of contact comprises metal wires.

* * * * *